(12) United States Patent
Roy et al.

(10) Patent No.: US 11,480,871 B2
(45) Date of Patent: Oct. 25, 2022

(54) APPARATUS AND METHOD FOR IMPROVING ACCURACY OF IMPRINT FORCE APPLICATION IN IMPRINT LITHOGRAPHY

(71) Applicant: CANON KABUSHIKI KAISHA, Tokyo (JP)

(72) Inventors: Nilabh K. Roy, Austin, TX (US); Mario Johannes Meissl, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 236 days.

(21) Appl. No.: 16/834,386

(22) Filed: Mar. 30, 2020

(65) Prior Publication Data

US 2021/0299921 A1 Sep. 30, 2021

(51) Int. Cl.
*G03F 7/00* (2006.01)
*B29C 59/02* (2006.01)

(52) U.S. Cl.
CPC .......... *G03F 7/0002* (2013.01); *B29C 59/02* (2013.01)

(58) Field of Classification Search
None
See application file for complete search history.

(56) References Cited

U.S. PATENT DOCUMENTS

| | | |
|---|---|---|
| 6,535,774 B1 | 3/2003 | Bode et al. |
| 8,945,444 B2 | 2/2015 | Lu et al. |
| 9,090,014 B2 | 7/2015 | Lu et al. |
| 10,534,259 B2 | 1/2020 | Choi et al. |
| 2008/0024741 A1* | 1/2008 | Butler ............... G03F 7/70716 355/18 |
| 2018/0154526 A1 | 6/2018 | Oguri et al. |
| 2018/0194014 A1 | 7/2018 | Bibi et al. |
| 2019/0018373 A1 | 1/2019 | Csonka |
| 2019/0033708 A1 | 1/2019 | Cherala et al. |
| 2019/0033709 A1 | 1/2019 | Cherala et al. |

* cited by examiner

*Primary Examiner* — Robert J Grun
(74) *Attorney, Agent, or Firm* — Canon U.S.A., Inc. IP Division (57) ABSTRACT

An imprint apparatus is provided. The imprint apparatus includes an imprint head, at least one cable assembly configured to supply a signal to the imprint head, and a cable assembly sensor configured to detect a state of the at least one cable assembly. The signal may include one or more of a voltage signal, a current signal, and a pneumatic signal. The cable assembly sensor may include a strain gauge configured to measure a strain of the at least one cable assembly or a load cell configured to measure a force on the at least one cable assembly. For example, the cable assembly may include an electric wire and/or a gas supply tube.

16 Claims, 6 Drawing Sheets

APPARATUS AND METHOD FOR IMPROVING ACCURACY OF IMPRINT FORCE APPLICATION IN IMPRINT LITHOGRAPHY

BACKGROUND

Field of Art

The present disclosure relates to nanoimprint lithography, and more particularly, to an apparatus for improving accuracy of final imprint force application in nanoimprint lithography.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate; therefore, nano-fabrication becomes increasingly important. Nano-fabrication provides for greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating one or more layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into and/or onto an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a solid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, formable material removal, dicing, bonding, packaging, and the like.

SUMMARY

An imprint apparatus is provided. The imprint apparatus includes an imprint head, at least one cable assembly configured to supply a signal to the imprint head, and a cable assembly sensor configured to detect a state of the at least one cable assembly. The signal may include one or more of a voltage signal, a current signal, and a pneumatic signal. The cable assembly sensor may include a strain gauge configured to measure a strain of the at least one cable assembly or a load cell configured to measure a force on the at least one cable assembly. For example, the cable assembly may include an electric wire and/or a gas supply tube. The imprint head may include an actuator to apply a force to a template. The imprint apparatus may include a motion controller configured to control the actuator based on the state detected by the cable assembly sensor.

In one embodiment, the imprint apparatus may further comprise a chuck for retaining a template; a magnification actuator configured to press the template via the chuck; and a voice coil actuator to apply an imprint force on the template via the chuck. The at least one cable assembly may include at least one of a cable connecting the magnification actuator to a piezo actuator and a tube to supply gas to the template. A motion (position) controller may be used to send at least a signal to the actuator to move the imprint head along a trajectory and to adjust the signal sent based on the detected state of the cable assembly. The cable assembly sensor may include a strain gauge attached to the at least one cable assembly and/or a load cell mounted to the at least one cable assembly.

A method of forming a layer on a substrate with a template retained by a chuck connected to an imprint head in which a calibrated imprint force is provided. The method may include performing a curing process on a substrate retained by an imprint head. A state of a cable assembly connected to one or both of the imprint head and the chuck is measured. An imprint force applied to the substrate is calibrated based on the measured state of the cable assembly. The imprint head may then be removed from the substrate after the curing process is complete. The state of the cable assembly may include a strain of the cable assembly or a force on the cable assembly. The cable assembly is configured to supply a signal to the imprint head by the cable assembly. The signal may include one or more of a voltage signal, a current signal, and a pneumatic signal. In one embodiment, the final imprint force may be applied to the substrate at an end of the curing process before separating the imprint head from the substrate.

A method for forming an article is provided. The method includes retaining a template by an imprint head; advancing the template to contact with a substrate, the substrate comprising a formable material dispensed thereon; curing the formable material; providing a signal to the imprint head by a cable assembly; measuring a state of the cable assembly; calibrating a final imprint force applied to the template based on the measured state of the cable assembly; and separating the template from the substrate. The state of the cable assembly includes a strain of the cable assembly or a force on the cable assembly. The signal includes one or more of a voltage signal, a current signal, and a pneumatic signal. Therefore, the cable assembly may at least one of an electric wire and a gas supply tube.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Nanoimprint System

Figure 1:
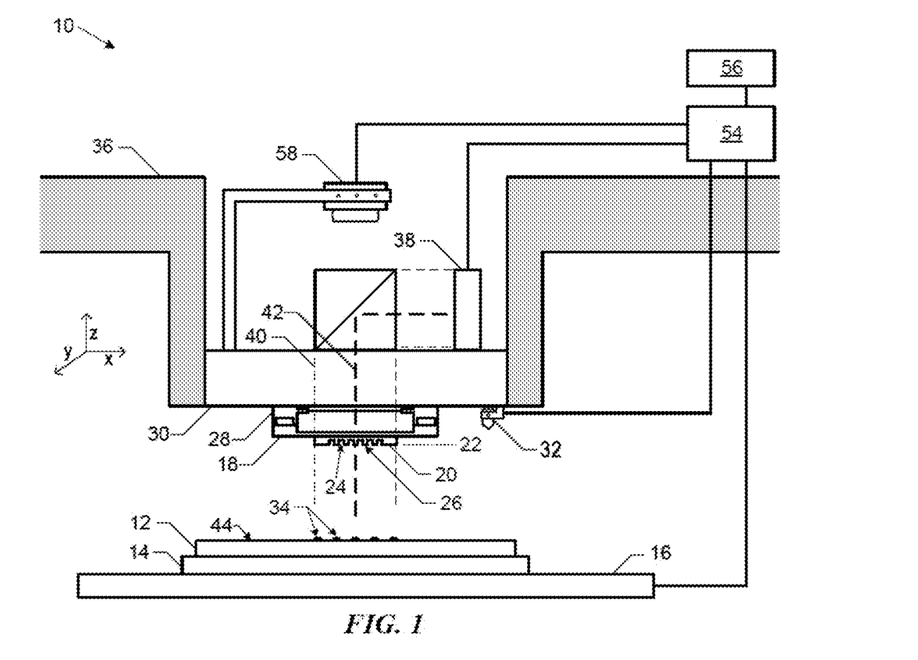
FIG. 1 is a diagram illustrating an apparatus.

FIG. 1 illustrates a nanoimprint lithography apparatus 10 in which an embodiment may be implemented. Apparatus 10 may be used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like.

Substrate 12 and substrate chuck 14 may be further supported by positioning stage 16. Stage 16 may provide translational and/or rotational motion along one or more of the x, y, z, 0, and 4 axes. Stage 16, substrate 12, and substrate chuck 14 may also be positioned on a base (not shown).

Spaced-apart from substrate 12 is template 18. Template 18 may include a body having a first side and a second side with one side having a mesa 20 (also referred to as mold 20) extending therefrom towards substrate 12. Mesa 20 may have a patterning surface 22 thereon. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12. Alternatively, surface 22 may be blank, i.e. without pattern features, in which case a planar surface can be formed on the substrate. In an alternative embodiment, when the patterning surface 22 is of the same areal size as the substrate, a layer can be formed over the entire substrate (e.g., whole substrate processing).

Template 18 may be coupled to template chuck 28. Template chuck 28 may be configured as, but not limited to, vacuum, pin-type, groove-type, electrostatic, electromagnetic, and/or other similar chuck types. Further, template chuck 28 may be coupled to the imprint head 30 which in turn may be moveably coupled to bridge 36 such that template chuck 28, head 30 and template 18 are moveable in at least the z-axis direction.

Apparatus 10 may further comprise a fluid dispense system 32. Fluid dispense system 32 may be used to deposit formable material 34 (e.g., polymerizable material) on substrate 12. Formable material 34 may be positioned upon substrate 12 using techniques such as drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations.

Fluid dispense system 32 may use different technologies to dispense formable material 34. When the formable material 34 is capable of jetting, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

Apparatus 10 may further comprise radiation source 38 that directs actinic energy 40 along path 42. Imprint head 30 and stage 16 may be configured to position template 18 and substrate 12 in superimposition with path 42. Camera 58 may likewise be positioned in superimposition with path 42. Apparatus 10 may be regulated by processor 54 in communication with stage 16, head 30, fluid dispense system 32, source 38, and/or camera 58 and may operate on a computer readable program stored in memory 56.

Either head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces actinic energy 40 (e.g., ultraviolet radiation) curing the formable material 134, that is, causing formable material 34 to solidify and/or cross-link conforming to a shape of surface 44 of substrate 12 and surface 22 of template 18, defining a formed layer on substrate 12. In an embodiment, the substrate 12, may be a substrate, an unpatterned template, or some other object on which the formable material 34 is shaped by the template 18.

Imprint Head

Figure 2:
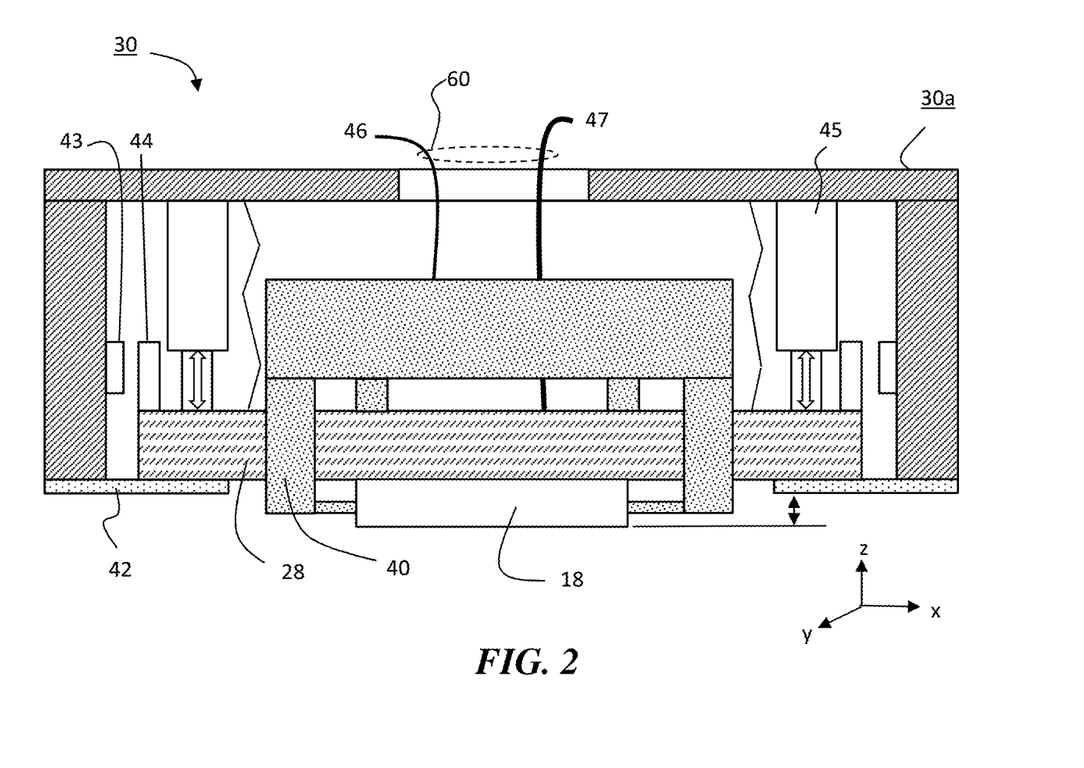
FIG. 2 is a cross sectional view of an imprint head.

FIG. 2 is a cross sectional view of an exemplary structure of an imprint head 30 that retains the template 18 with the template chuck 28 and controls the movement of the template 18 during the imprint process. As shown, the imprint head 30 has a frame 30a inside which various devices or components are assembled. In the current embodiment, the template 18 is retained with a template chuck 28 inside of the frame 30a. The periphery of the template chuck 28 is supported by a soft flexure 42 at the bottom periphery of the frame 30a. The soft flexure 42 is designed to be made of a material and have a geometry such that it has high stiffness on an XY plane and a low stiffness along a Z-direction. The high stiffness on the XY plane prevents motion of the template 18 the XY plane, while the low stiffness along the Z-direction provides certain limits to the motion of the template 18 along the Z-direction. During the imprint process, the template 18 is often deformed by a magnification actuator 40 which applies stresses to various locations of the template 18. The magnification actuator 40 includes multiple piezo actuators which are connected to cables 46 which supply power, control, and transmit sensor information. The imprint head 30 also includes a set of springs 48 connected between the top wall of the frame 30a and the magnification actuator 40 to offset the weight of the magnification actuator 40. Therefore, the springs 48 have a controlled stiffness along the Z-direction. The magnification actuator 40 may also be coupled to the template chuck 28. An encoder 43 may be mounted on an interior side wall of the frame 30a. Aligned with the encoder 43 is an encoder scale 44 which may be disposed on a top surface of the template chuck 28. The template chuck 28 may also be connected to the frame 30a via one or more springs which have a controlled stiffness in the Z-direction. The pair of the encoder 43 and the encoder scale 44 provides positional information of the template 18. The imprint head 30 further includes one or more voice coil actuators 45 to generate a force applied to the template 18 along the Z-direction. Tubes 47 extending from the template chuck 28 are connected to a gas supply to control the pressure applied to the template 18. The cables 46, wires, and/or tubes 47 are configured as at least one cable assembly 60 which includes one or more cables 46, wires, and/or tubes 47. The cable assembly 60 may include cables 46, wires, and/or tubes 47 which are bundled together. The cable assembly 60 may include a plurality of cable subassemblies. The cables 46 and wires may transmit electrical signals and/or electrical power to and from the imprint head 30. The tubes 47 may transmit pneumatic signals and/or pneumatic power to and from the template chuck 28. The cable assembly 60 is connected to one or both of the imprint head 30 and the template chuck 28. The voice coil actuators 45 may be connected to one or more cables 46 which supply power, control, and transmit sensor information. The imprint head 30 may include additional cables which supply power, sensor, and/or control information. The imprint head 30 may also include additional tubes 47 which supply environmental gas (e.g. helium) though or below the imprint head 30. The imprint head 30 is a component which applies a controlled force to an object of interest. A non-limiting exemplary imprint head applies a controlled force to a template chuck, the controlled force is transmitted to the template, the template transmits the controlled force to the formable material on the substrate 12. Another non-limiting exemplary imprint head applies a controlled force to a replica template chuck. Another non-limiting exemplary system includes two or more imprint heads each which control forces acting upon and/or between one or more objects (substrates) in the system such as a patterned template, a blank replica template, or a wafer. Another non-limiting exemplary system applies a controlled force while planarizing a substrate (for example a wafer or a replica blank) with a featureless template. In another non-limiting example, the imprint head applies a translation motion along a horizontal direction in which the force causing the motion is controlled. The imprint head supplies a force that moves something in a shaping system.

Final Imprint Force Measurement

During the imprint process, a contact force is applied on the substrate at the end of the curing process before separation of substrate and the template. In an embodiment, the substrate may be a semiconductor wafer, a blank template, or some other object on which the formable material 34 is shaped by the template 18. Such contact force is often referred to as a final imprint force. The final imprint force is one of the critical parameters that needs to be controlled with a 0.1 N precision (for example, the method described herein may also be used to control the final imprint force with 0.01 N–1 N precision) on the tool to achieve the target overlay specification for NIL. The final imprint force that was used can be estimated based on measured overlay of an imprinted film as described in US patent publication No. 2019/0033709-A1 which is hereby incorporated by reference. Measurement during imprint of this final imprint force is extremely difficult as contact-based force sensors would be intrusive to the imprint process and may significantly affect the alignment, overlay, and other process specifications. Currently, the force may be estimated through the current running through each of the one or more voice coil actuators. However, it has been observed that this force estimation has precision and repeatability issues under external disturbances to hit target specifications across multiple runs. As the imprint head moves from one position to another, although the position may settle within a short period of time, the force (current) flowing through the voice coil actuator continues decaying to maintain the constant position and the decay magnitude can be larger than target specifications. This decay behavior may vary from tool to tool, and may even vary during multiple runs on the same tool. Hence, there is a need to improve our estimate of this force during imprinting.

Figure 3:
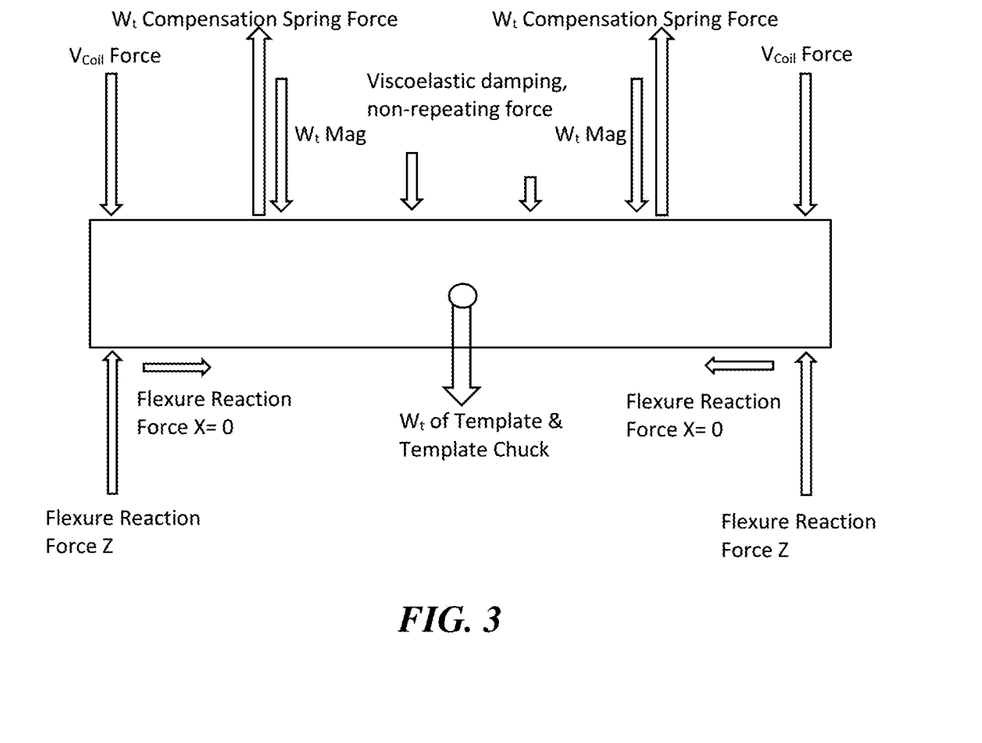
FIG. 3 illustrates the forces exerted on the template chuck and template.

The applicant has determined that a leading cause of an error in estimating the force has been found to be the development and relaxation of stress in the cables and tubes connected to the imprint head as the imprint head moves between different positions. This behavior has been found to be motion profile dependent and can depend upon many factors including the step size between the initial and final positions of the imprint head, velocity of the imprint head from the initial position to the final position, all previous states of the cables and tubes including the initial stress in the cables and tubes. This viscoelastic behavior of cables and tubing induces damping in the system leading to bidirectional repeatability error (hysteresis) in force and decaying force magnitudes making it difficult to estimate the force within target specifications. Furthermore, the relative contact between the cables or between the cables and the stationary parts of the tool can introduce friction that leads to non-linearity and non-repeatable force behavior; and thus making force estimation difficult. The repeatable forces, including spring forces, flexure related forces, and the non-linear disturbance including the strain development in the cables on the template chuck are shown in FIG. 3. The force along the Z-direction, F(z), can be represented as:

$$F(z) = F_{repeatable}(Z) + F_{disturbance}(Z).$$

The repeatable force $F_{repeatable}(Z)$ includes the downward force generated by the voice coil actuator, the weight of the magnetic actuator, and weight of the chuck and template and the upward force exerted from the weight compensation spring force and the flexure. The non-repeatable disturbance force includes those caused by viscoelastic damping of the cables.

Figure 4:
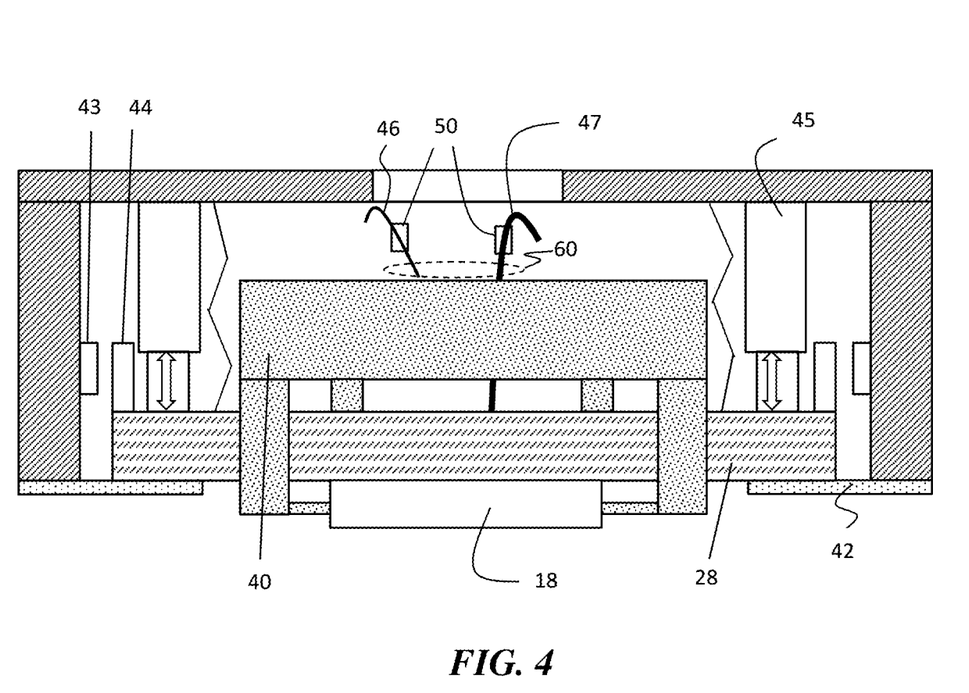
FIG. 4 shows an embodiment for measuring the non-repeating force exerted on the template as shown in FIG. 3.

Measuring the strain and/or stress in the cables in the system in a vertical (Z) direction can provide an estimate of the force magnitude change due to either decaying behavior or a disturbance affecting the cables and hence the force. In this context, cables refers to both cables and tubes. Once force change due to the cable stress relaxation is measured, deviation from the nominal force can be removed from the final imprint force estimation. Since the sensor is only for measuring the strain or force in the cables and tubing instead of the final imprint force, it does not need a large measurement range. In an embodiment, the sensors are used to estimate a disturbance force that the cables exert on the frame. FIG. 4 shows one embodiment for measuring the decaying behavior in real time and for correcting any fluctuations in the behavior from imprint-to-imprint and/or substrate-to-wafer disturbances or fluctuations. As shown in FIG. 4, a strain gauge 50 is attached to one or more of the cables 46 connecting to the magnification actuator 40 so as to measure the strain on the cables 46. Another strain gauge 50 is attached to the tubes 47 connecting a gas supply to the template chuck 28. The tubes 47 may also supply environmental gas underneath the template 18. In an embodiment, one or more of the strain gauges 50 may be attached to the cable assembly 60, a portion of the cable sub-assembly, and/or the cable sub-assemblies. The measured strain provides an estimate of the force magnitude change due to either decaying behavior or a disturbance affecting the cables and tubes. Once the measurement of the force change is estimated, the deviation from the nominal behavior can be removed to obtain a more accurate estimate of the final imprint force and/or the imprint force trajectory.

Figure 5:
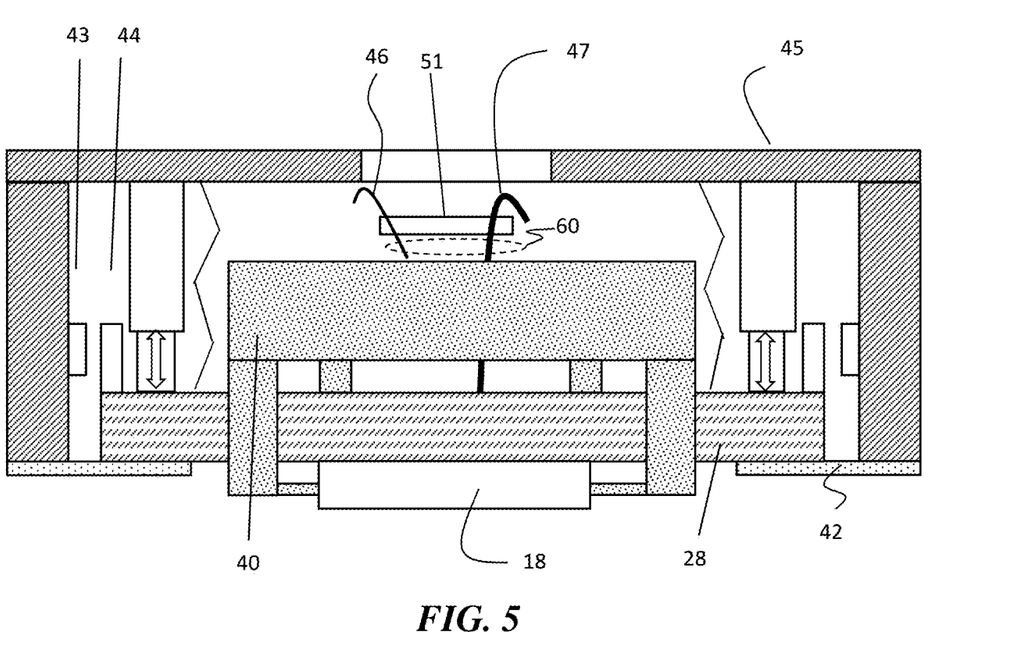
FIG. 5 shows another embodiment for measuring the non-repeating force exerted on the template as shown in FIG. 3.
Figure 6:
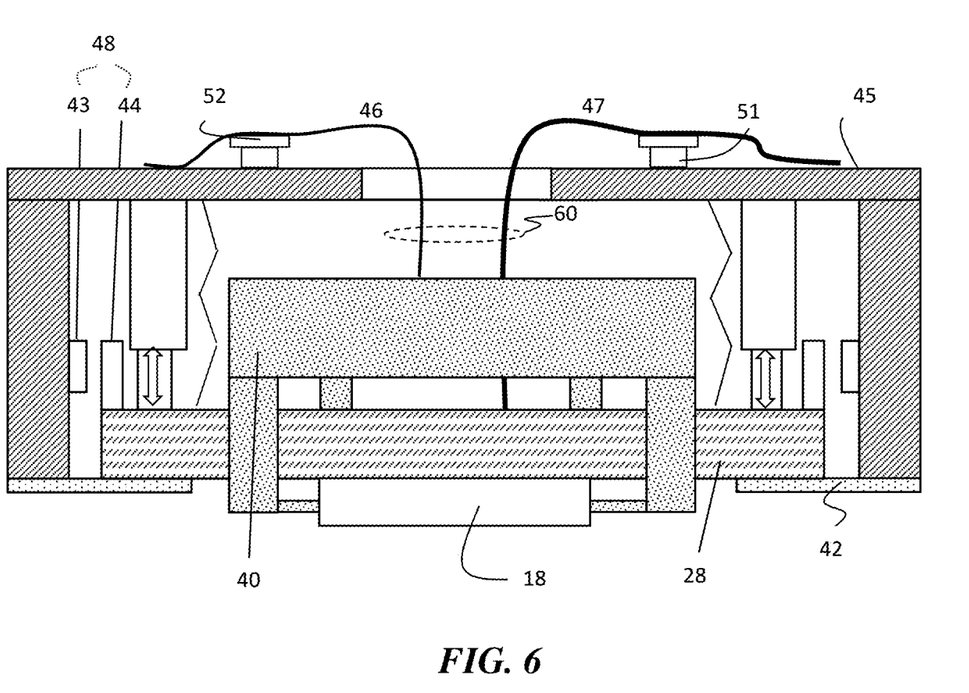
FIG. 6 shows the arrangement of the cables and load cells used in FIG. 5 for mearing the non-repeating force exerted on the template.

FIG. 5 shows another embodiment for measuring the force magnitude change due to the decaying behavior and or the disturbance. As shown in FIG. 5, a force transducer, for example, a load cell 51, is attached to the cables 46 and the tubes 47 to measure the tension, compression, pressure, or torque thereon. Similar to the strain gauge 50, the measured force provides an estimate of the cable and tubing disturbance forces. Once force change due to the cable stress relaxation is measured using the load cell 51, deviation from the nominal force can be removed from the final imprint force estimation. In an embodiment, one or more force transducers (for example load cell 51) may be attached to the cable assembly 60, a portion of the cable sub-assembly, and/or the cable sub-assemblies. FIG. 6 shows an exemplary arrangement of the load cell 51. As shown, the load cell 51 is mounted on the imprint head frame 30a. A cable tray 52 may be arranged on the load cell 51 for supporting a plurality of the cables 46 and the tubes 47. In an embodiment, the cable tray 52 is annular in shape and supported one or more load cells (for example 3) or some other shape. In an embodiment, the cable tray 52 is a plurality of separate trays. In an embodiment, the cable assembly 60 includes one or more cable tray(s) 52. Such measurement arrangements allow the measurement of the force to be performed without significantly altering or degrading the stiffness in lateral directions as the imprint head moves in the vertical direction which is important for alignment and overlay performance. Therefore, a more precise measurement employing more sensitive load cells can be selected to improve the precision of the measurement without degrading alignment and overlay performance.

Figure 7:
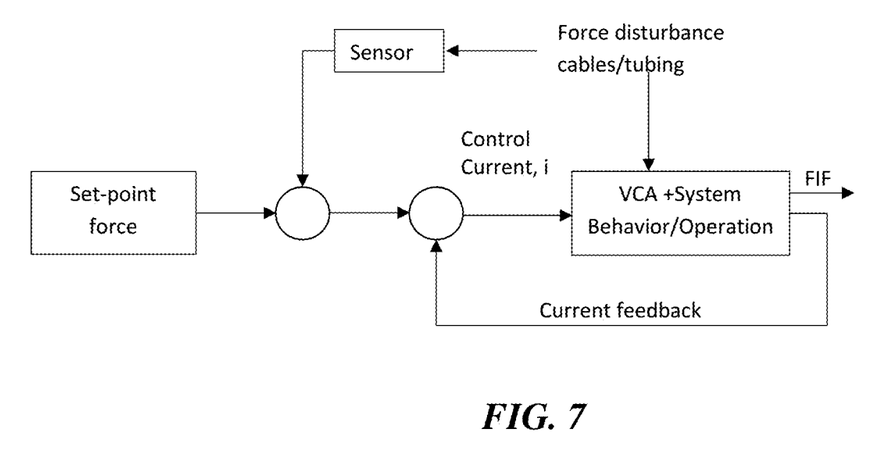
FIG. 7 shows an exemplary method for calibrating a final imprint force applied in an imprint process.

Once the measurement of the decaying behavior or the disturbance is performed, the final imprint force can be estimated. FIG. 7 shows a schematic of an embodiment of how the force sensor signal can be used for adjusting the force set-point to compensate for the disturbance that affects the imprint head motion and/or ultimately the final imprint force exerted by the template on the formable material. As shown, a sensor is used to measure the state of the cables and tubes connecting the cables and tubes from both the magnification actuator and the template chuck. If a change of strain or force on the cables and/or the tubes is measured, the strain and/or force change is applied to calculate an adjusted new set point for imprint force. A control current i can thus be calculated and be applied through the voice coil actuator(s) to the template. The method allows cable and tube disturbance forces to be measured and compensated for in real time even after the template is brought into contact with the substrate. In addition to the steps as shown in FIG. 6, the movement, moving trajectory, and/or imprint force trajectory of the imprint head may also be controlled or adjusted based on the strain or force measured from the cables and the tubes. The control of the trajectory can be achieved by a controller 48 in connection with the encoder and the encoder scale as shown in FIG. 6. The controller 48 may include a motion controller which sends control signal to one or more components of the imprint head. The control signals may include one or more of digital signals; analog signals; current signals; voltage signals; optical signals; pneumatic signals; or any other signal which instructs one or more components of the imprint head to apply a force at a specific time or along a force trajectory. In an embodiment, the control signals are adjusted based on the detected states of the cable assembly 60.

Figure 8:
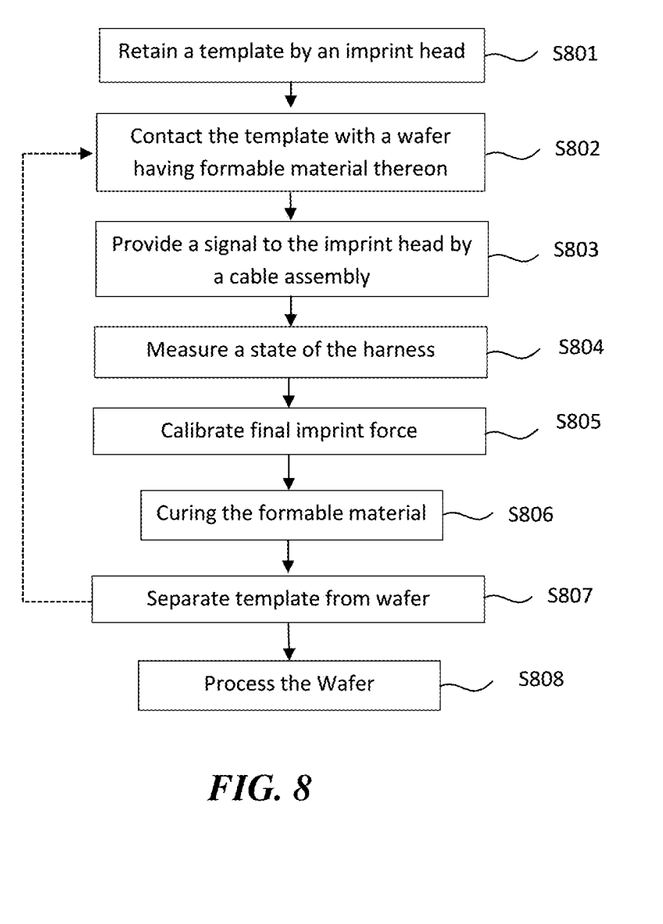
FIG. 8 shows a method for manufacturing an article using the method as shown in FIG. 7.

FIG. 8 shows a process for forming an article using the apparatus and method for estimating the final imprint force described above. In step S801, a template is retained with a template chuck of an imprint head. The template is advanced to be in contact with a formable material dispensed on a substrate in step S802. A signal, including one or more of a voltage signal, a current signal, a supply of environmental gas (for example helium, clean dry air, nitrogen, etc.) which is used in the imprinting process, and a pneumatic signal, which is supplied to the imprint head by the cable assembly 60 in step S804. The state of the cable assembly 60 is measured, for example, by measuring the strain of the cable assembly 60 or the force on the cable assembly 60, in step S805. The measured state is then applied to correct the final imprint force and/or the imprint force trajectory to be exerted on the formable material through the template in step S806. In step S803, the formable material is cured. Once the curing process is complete, the template is removed from the substrate in step S807. Processes S802 to S807 may be repeated until all fields on the substrate have been cured with the corrected imprint force. Further processes can then be performed on the substrate in step S808.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An imprint apparatus, comprising:
   an imprint head;
   at least one cable assembly configured to be connected to the imprint head;
   a cable assembly sensor configured to detect a state of the at least one cable assembly;
   an actuator of the imprint head configured to apply a force to a template; and
   a motion controller configured to control the actuator based on the state detected by the cable assembly sensor.

2. The imprint apparatus according to claim 1, wherein the cable assembly sensor includes a strain gauge configured to measure a strain of the at least one cable assembly or a load cell configured to measure a force on the at least one cable assembly.

3. The imprint apparatus according to claim 1, wherein the cable assembly supplies a signal to one or both of the imprint head and a chuck, and wherein the signal includes one or more of a voltage signal, a current signal, and a pneumatic signal.

4. The imprint apparatus according to claim 1, wherein the cable assembly includes at least one electric wire.

5. The imprint apparatus according to claim 1, wherein the cable assembly includes at least one gas supply tube.

6. The imprint apparatus according to claim 1, further comprising:
   a chuck for retaining a template;
   a magnification actuator configured to apply stress to the template; and
   the actuator is a voice coil actuator to apply an imprint force to the template via the chuck,
   wherein the at least one cable assembly includes at least one of a cable connecting to the magnification actuator and a tube to supply gas to the chuck.

7. The imprint apparatus according to claim 1, further comprising a motion controller configured to send at least a control signal to instruct the imprint head to apply a force to a template along a force trajectory that moves the template along a trajectory and to adjust the control signal that is sent based on the detected state of the cable assembly.

8. The imprint apparatus according to claim 1, wherein the cable assembly sensor includes a strain gauge attached to the at least one cable assembly.

9. The imprint apparatus according to claim 1, wherein the cable assembly sensor includes a load cell mounted to the at least one cable assembly.

10. A method of forming a layer on a substrate with a template retained by a chuck connected to an imprint head, comprising:
    measuring a state of a cable assembly connected to one or both of the imprint head and the chuck;
    calibrating an imprint force applied between the template and the substrate based on the measured state of the cable assembly; and
    applying the calibrated imprint force with the template.

11. The method according to claim 10, wherein the state of the cable assembly includes a strain of the cable assembly or a force on the cable assembly.

12. The method according to claim 11, further comprising supplying a signal with the cable assembly to one or both of the imprint head and the chuck.

13. The method according to claim 11, wherein the signal includes one or more of a voltage signal, a current signal, and a pneumatic signal.

14. The method according to claim 10, wherein the calibrated imprint force is applied at an end of curing formable material under the template and before separating the template from the substrate.

15. The method according to claim 10, further comprising sending at least a signal to move the imprint head along a force trajectory and to adjust the signal sent based on the measured state of the cable assembly.

16. A method for forming an article, comprising:
    retaining a template by a chuck wherein the chuck is connected to an imprint head;
    advancing the template to contact with a substrate, the substrate comprising a formable material dispensed thereon;
    providing a signal to the imprint head by a cable assembly;
    measuring a state of the cable assembly;
    calibrating an imprint force applied to the template based on the measured state of the cable assembly;
    applying the calibrated imprint force to the template;
    curing the formable material; and
    separating the template from the substrate.

* * * * *